(12) United States Patent
Carpenter et al.

(10) Patent No.: US 12,181,500 B2
(45) Date of Patent: Dec. 31, 2024

(54) EMI RESISTANT, OPTIMIZED ANTENNA

(71) Applicant: Honeywell International Inc., Morris Plains, NJ (US)

(72) Inventors: Kerrance Lynn Carpenter, Wake Forest, NC (US); Douglas Troy Collier, Raleigh, NC (US)

(73) Assignee: Honeywell International Inc., Charlotte, NC (US)

( * ) Notice: Subject to any disclaimer, the term of this patent is extended or adjusted under 35 U.S.C. 154(b) by 568 days.

(21) Appl. No.: 17/319,258

(22) Filed: May 13, 2021

(65) Prior Publication Data

US 2022/0365119 A1 Nov. 17, 2022

(51) Int. Cl.
*G01R 21/14* (2006.01)
*H01Q 23/00* (2006.01)

(52) U.S. Cl.
CPC ............ *G01R 21/14* (2013.01); *H01Q 23/00* (2013.01)

(58) Field of Classification Search
CPC .... H01Q 23/00; H01Q 1/50–52; H01Q 5/335; H01Q 5/50; H01Q 9/285; H01Q 1/2233; H01Q 9/0457; H01Q 9/065
See application file for complete search history.

(56) References Cited

U.S. PATENT DOCUMENTS

| | | | |
|---|---|---|---|
| 5,153,600 A | 10/1992 | Metzler et al. | |
| 6,152,764 A | 11/2000 | Robinson et al. | |
| 6,766,698 B1 | 7/2004 | Robinson et al. | |
| 9,506,960 B2 | 11/2016 | Tseng et al. | |
| 9,615,150 B2 | 4/2017 | Kashiwagi et al. | |
| 9,714,965 B2 | 7/2017 | Crittenden | |
| 10,753,810 B2 | 8/2020 | Mastrogiacomo et al. | |
| 2004/0130843 A1 | 7/2004 | Tsutsui et al. | |
| 2006/0044203 A1 | 3/2006 | Shirosaka et al. | |
| 2006/0254356 A1 | 11/2006 | Liu et al. | |
| 2007/0210969 A1 | 9/2007 | Vance | |
| 2010/0164825 A1* | 7/2010 | Lee ................... | H01Q 9/285 343/795 |

(Continued)

FOREIGN PATENT DOCUMENTS

| | | |
|---|---|---|
| CN | 111774318 A | 10/2020 |
| EP | 1750368 A1 | 2/2007 |

(Continued)

OTHER PUBLICATIONS

Itron, LTE Exernal Antenna, Specifications; retrieved from https://www.itron.com/-/media/feature/products/documents/spec-sheet/101461sp01-lte-external_antenna_web.pdf Retrieved on: Apr. 30, 2020 (2 pages total).

(Continued)

*Primary Examiner* — David E Lotter
*Assistant Examiner* — Aladdin Abdulbaki
(74) *Attorney, Agent, or Firm* — John Maldjian, Esq.; Stevens & Lee PC

(57) ABSTRACT

One embodiment is a device, which comprises a cable attached at a first end to a radio module, the cable having a plurality of electro-magnetic interference (EMI) resistant elements connected at a plurality of positions, a radial board wherein the cable is attached thereto at a second end, and an antenna connected to the radial board, the antenna being configured to receive power from the radio module and to radiate.

6 Claims, 5 Drawing Sheets

(56) References Cited

U.S. PATENT DOCUMENTS

| | | | | |
|---|---|---|---|---|
| 2011/0063172 | A1* | 3/2011 | Podduturi | H01Q 5/371 |
| | | | | 343/700 MS |
| 2012/0060606 | A1 | 3/2012 | Lakich et al. | |
| 2012/0126793 | A1 | 5/2012 | Loy | |
| 2013/0002510 | A1 | 1/2013 | Azulay et al. | |
| 2013/0241798 | A1 | 9/2013 | Lee et al. | |
| 2013/0289788 | A1 | 10/2013 | Gupta et al. | |
| 2014/0157907 | A1 | 6/2014 | Johnson et al. | |
| 2014/0306846 | A1 | 10/2014 | Nakatsu et al. | |
| 2015/0061644 | A1 | 3/2015 | Parks | |
| 2016/0209464 | A1 | 7/2016 | Crittenden | |
| 2017/0187116 | A1* | 6/2017 | Hong | H01Q 9/0407 |
| 2019/0393608 | A1* | 12/2019 | Aliakbarian | H01Q 5/50 |
| 2020/0016905 | A1 | 1/2020 | Walsh | |
| 2020/0169050 | A1 | 5/2020 | Walsh et al. | |

FOREIGN PATENT DOCUMENTS

| | | | |
|---|---|---|---|
| KR | 20080067914 | A | 7/2008 |
| KR | 101364941 | B1 | 2/2014 |

OTHER PUBLICATIONS

PulseLarsen Antennas: Smart Meetering, Retrieved from: https://pulselarsenantennas.com/wp-content/uploads/2017/05/PulseLarsen_SmartMeter_Flyer_2017.pdf Retrieved on: Apr. 30, 2020 (11 pages total).

Philips Magnetic Products, "Cable Shielding", Philips Components, Document order No. 9398 237 28011, Date of release: Feb. 1997, Philips Electronics N.V. 1998 (27 pages total).

Parker, Carole U., "Using Ferrites to Suppress EMI" Jul. 1, 2011, Retrieved from: https://incompliancemag.com/article/using-ferrites-to-suppress-emi/ Retrieved on: Mar. 31, 2021 (43 pages total).

Powergrid International, Metering, Smart Grid, Issue 12 and vol. 19, "Preventing Electric Meter Fires: Two Perspectives", Dec. 15, 2014 (16 pages total).

Brooks Utility Products, A Tyden Group Company "Portable Meter Socket Jaw Tester", 2020, Retrieved from: http://www.brooksutility.com/products/122, Retrieved on: Nov. 4, 2020 (2 pages total).

* cited by examiner

EMI RESISTANT, OPTIMIZED ANTENNA

CROSS-REFERENCE TO RELATED APPLICATIONS

This application incorporates by reference in its entirety, application Ser. No. 17/247,232 entitled "LTE Antenna Optimized for North American Electricity Meters", filed Dec. 4, 2020.

BACKGROUND

It is important for some computing devices to be resistant to electro-magnetic interference (EMI). For example, an electricity meter could be compromised through an intentional EMI attack or through indirect EMI caused by its own components. The meter's antennas are the most susceptible components to EMI.

One way to make an antenna less susceptible to EMI is to shorten the length of its antenna feed cable and/or to coat the cable with an EMI resistant material, such as ferrite. Ferrite or another suitable material can absorb heat and can help the antenna to resist the attack or to sustain less interruption to its normal operation, and/or to sustain less damage. The EMI resistant material, however, causes the antenna to receive less energy, which it needs to radiate in the most efficient manner. Thus, techniques to make an antenna resistant to EMI result in an antenna that has degraded performance.

SUMMARY OF THE INVENTION

One embodiment is a device, which comprises a cable attached at a first end to a radio module, the cable having a plurality of electro-magnetic interference (EMI) resistant elements connected at a plurality of positions, a radial board wherein the cable is attached thereto at a second end, and an antenna connected to the radial board, the antenna being configured to receive power from the radio module and to radiate, wherein the antenna has first and second portions, the first and second portions being mechanically asymmetrical, and wherein an electrical effect between plurality of EMI resistant elements and the first and second portions results in the antenna being substantially electrically symmetrical.

Another embodiment is an electricity meter including a meter body, a power supply connected to the meter body, a metering unit connected to the power supply and configured to measure an amount of power that passes through the meter body, and a communication unit connected to the metering unit, including at least one antenna having a first portion and a second portion, the communication unit connected to at least a portion of the power supply and including an electro-magnetic interference (EMI) resistant material thereupon, wherein the first and second portions of the antenna are mechanically asymmetrical, and wherein an electrical effect between the EMI resistant material and the first and second portions of the antenna result in the antenna being substantially electrically symmetrical.

In another embodiment, a method includes providing a cable attached at a first end to a radio module, the cable having a plurality of ferrite elements connected at a plurality of positions, providing a radial board wherein the cable is attached thereto at a second end, and providing an antenna connected to the radial board, the antenna being configured to receive power from the radio module and to radiate, wherein the step of providing an antenna further comprises, providing a first and a second structural component having a first characteristic of being mechanically asymmetrical and a second characteristic of being substantially electrically symmetrical.

DETAILED DESCRIPTION OF THE INVENTION

Figure 1:
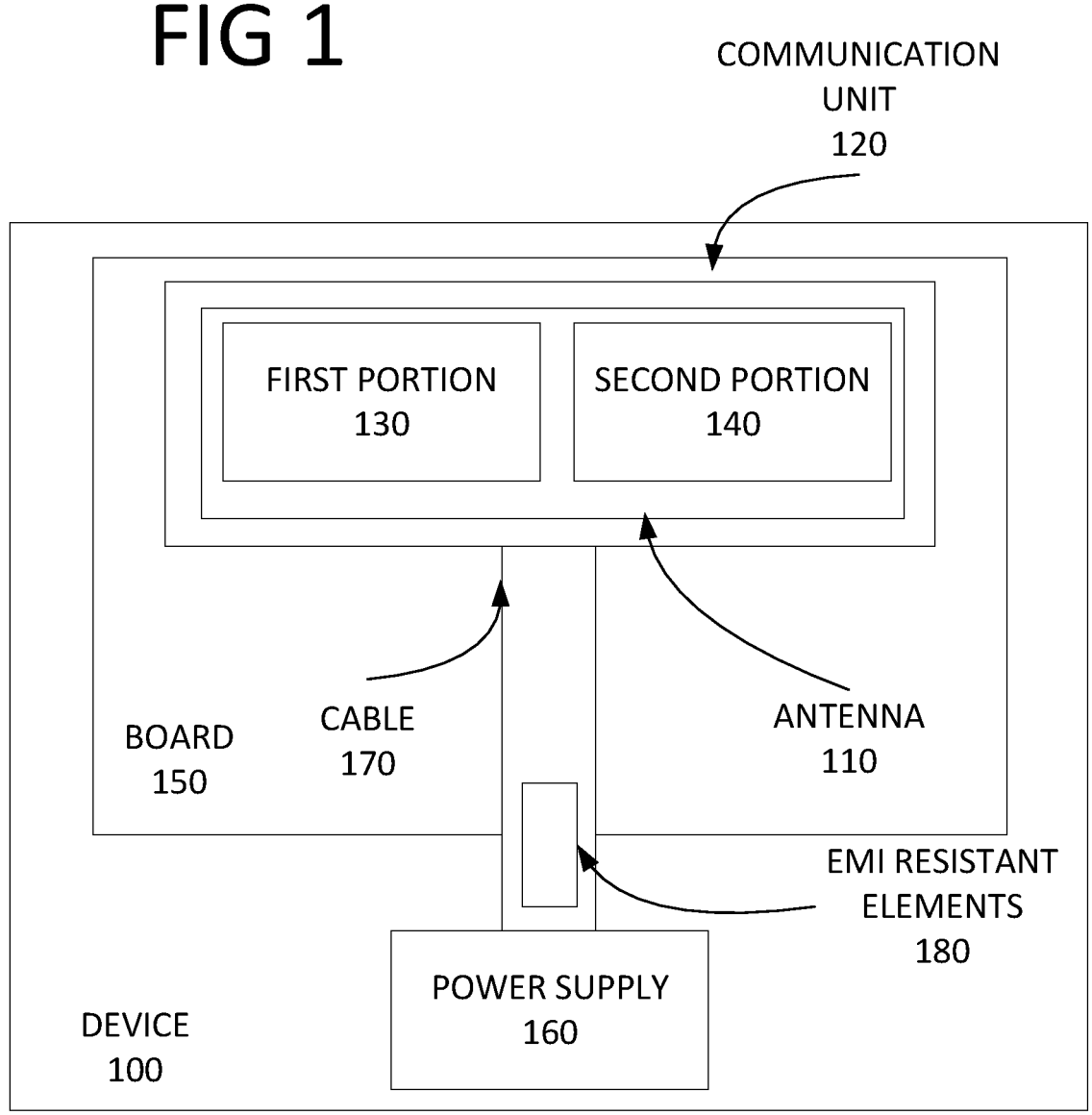
FIG. 1 is a diagram of an electro-magnetic interference (EMI) resistant, optimized antenna according to one embodiment.

FIG. 1 illustrates a device 100 that includes an electro-magnetic interference (EMI) resistant, optimized antenna 110 according to one embodiment. Device 100 can be any device that can utilize the antenna 110. In one example, the device 100 is an electricity meter, such as a Honeywell A4 electricity meter. An electricity meter like the A4 includes at least a meter body, a power supply connected to the meter body, and a metering unit connected to the power supply and configured to measure an amount of energy that passes through the meter body [not shown].

A communication unit 120 is connected to the metering unit, or other element of the device 100. The communication unit 120 includes the antenna 110. The antenna 110 has a first portion 130 and a second portion 140. In one example, the first and second portions 130 and 140 have a different shape such that they are not symmetric (mechanically asymmetrical). In this example, the mechanically asymmetrical first and second portions 130 and 140 are also electrically balanced such that the antenna 110 is electrically symmetrical with respect to all of the elements on a board 150 where the antenna 110 is affixed. The board 150 typically has other structures (not shown), which impact the performance of the antenna 110. To this end, an electrically symmetrical antenna 110 can be balanced against all components on the board 150 to achieve electrical symmetry.

The communication unit 120 is connected to at least a portion of a radio module 160 via a cable 170. The cable 170 can be a coaxial cable, for example. The cable 170 includes electro-magnetic interference (EMI) resistant elements 180. The EMI resistant elements 180 can be ferrites, or other suitable material, for example. The EMI resistant elements 180 can be welded or attached to the cable 170 in various manners, in different embodiments. The EMI resistant elements 180 are configured to shield the device 100 from unintentional or intentional EMI that could disrupt the antenna 110.

In one example, the EMI resistant elements 180 include a plurality of cylinders. The cylinders can be any suitable EMI resistant material. In one embodiment, ferrite is used. For example, two frequency-tuned ferrite cylinders can be placed on the cable 170. In another example, the cable 170 can be a 70-millimeter long, 1.13-millimeter diameter UFL cable with one or more 2.5-inch long ferrites added, which can be type 61 material. In this way, the type 61 material can suppress RF energy in a manner that is suitable for the antenna 110 of FIG. 1.

The radiated efficiency of the antenna 110 is therefore optimized, because the device 100 is now tuned specifically with respect to the cable 170 that includes the EMI resistant elements 180. It should be understood that other arrangements for the plurality of cylinders are possible, depending on the configuration of the board 150. The components and type of device the board 150 resides in, impact the antenna 110 because these components through their normal operation can interfere with the antenna. Thus, the tuning of the antenna 110 to the EMI resistant elements 180 changes based on the environment in which it resides, so it is natural that and electrical symmetry requires tuning for that environment.

Figure 2:
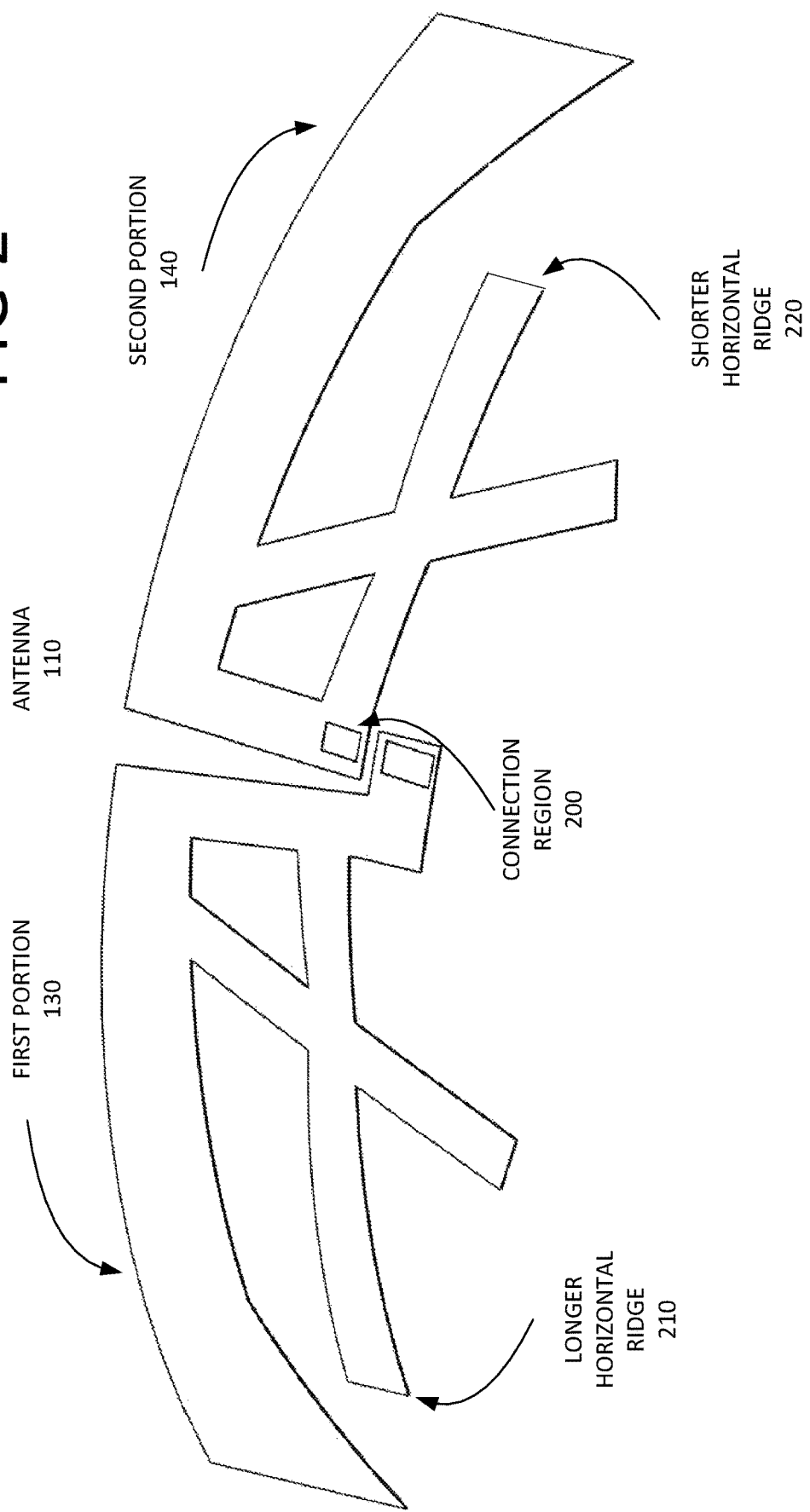
FIG. 2 is a diagram of an antenna used in one embodiment.

FIG. 2 is a diagram of an antenna used in the EMI resistant, optimized antenna according to one embodiment. The antenna 110 includes the first portion 130 and a second portion 140. A connection region 200 can be used to connect a cable [not shown], such as a coaxial cable, to the antenna 110 such that power can be applied to the antenna 110 and it can radiate and/or otherwise operate normally. The first portion 130 of the antenna 110 has a longer horizontal ridge 210. The second portion 140 of the antenna 110 has a shorter horizontal ridge 220. Because the length and/or width of the longer horizontal ridge 210 is different from that of the shorter horizontal ridge 220, the antenna 110 is not mechanically symmetrical. In one example, the difference in geometry between the longer horizontal ridge 210 and the shorter horizontal ridge 220 is directly related to a new impedance that the cable has (due to the addition of EMI resistant elements). This could be, for example, a difference in length of 3 millimeters between the longer horizontal ridge 210 and the shorter horizontal ridge 220. Other differences in dimension (length and/or width) between the first portion 130 and the second portion 140 is possible depending on the nature of the environment where the antenna 110 is radiating.

Figure 3:
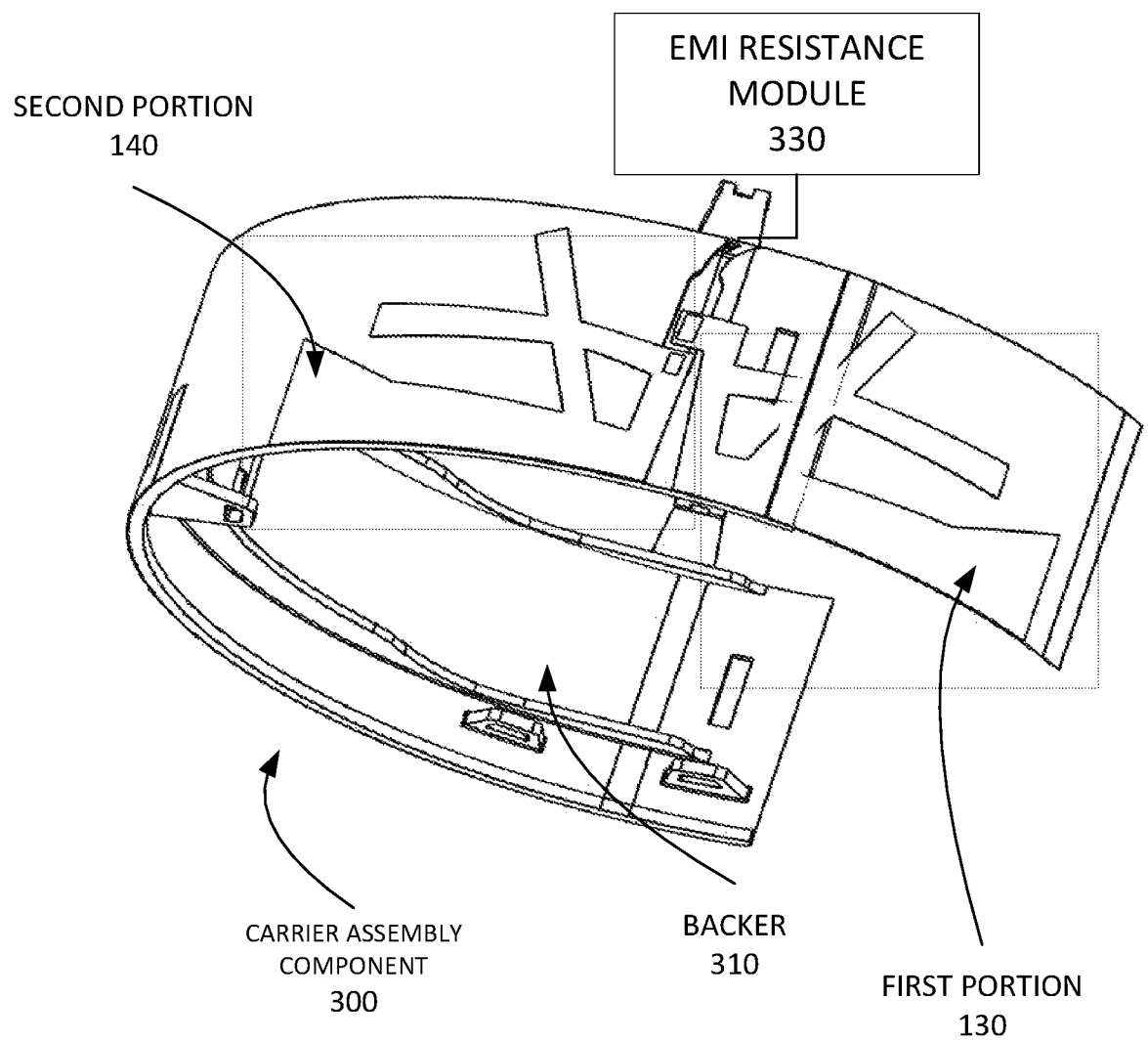
FIG. 3 is a diagram of a specific implementation of the antenna used in one embodiment.

FIG. 3 is a diagram of a more specific implementation of the antenna used in one embodiment. FIG. 3 includes a carrier assembly component 300 from a side view where the first portion 130 and the second portion 140 are visible. In the embodiment of FIG. 3, the first portion 130 and the second portion 140 are shown as having individual connection points that contact a backer 310 via a connection region 320. The environment of FIG. 3 is not necessary to carry out various embodiments, however it is illustrative of one suitable implementation.

The longer horizontal ridge 210 and the shorter horizontal ridge 220 are shown on the carrier assembly component 300. The geometry of the longer horizontal ridge 210 and the shorter horizontal ridge 220 can be based on the nature of the other components (not shown) which can impact the antenna 110. The impedance the antenna experiences can be tuned to the impact of an EMI resistance module 330. The EMI resistance module 330, in one example, includes a coaxial cable that connects to the carrier assembly component 300 physically and electrically. The coaxial cable can have an EMI resistant material applied, such as a ferrite which can protect the antenna 110 from EMI either intentional or unintentional.

Figure 4:
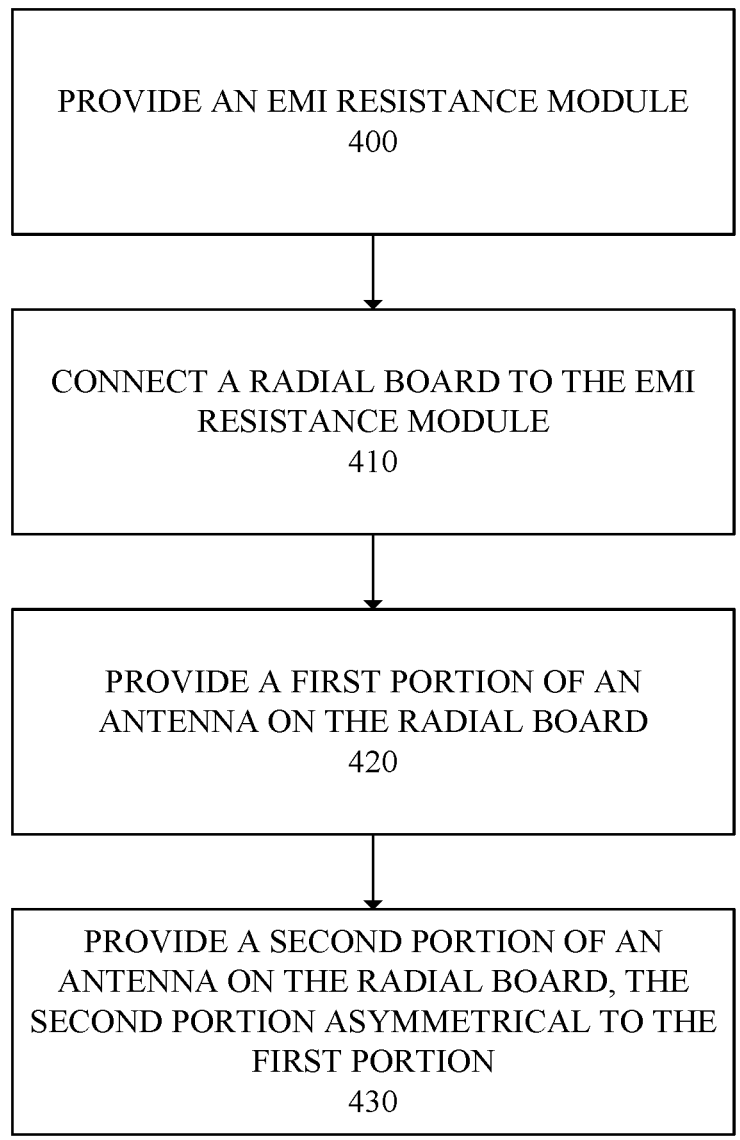
FIG. 4 is a flowchart that illustrates the steps in making the EMI resistant, optimized antenna according to one embodiment.

FIG. 4 is a flowchart that illustrates the steps in making the EMI resistant, optimized antenna. The steps of FIG. 4 can occur, for example, during the manufacturing of an antenna designed for an electricity meter. At step 400, an EMI resistance module is provided. This can include, for example, a ferrited cable connected to an antenna. The ferrited cable can have one or more ferrite elements on it. At step 410, the EMI resistance module is connected to a radial board, so it can supply power, for example, to an antenna and the antenna can radiate and/or otherwise operate as intended. To this end, first and second sections of the antenna are connected to the radial board at steps 420 and 430. The second section is asymmetrical to the first section. In this manner the antenna can be balanced and operate in an enhanced manner when used in conjunction with the EMI resistance module.

For instance, the length of the coaxial cable, and/or the number of ferrite elements in the EMI resistance module impacts a source-impedance that the antenna experiences. The antenna can be tuned to maximize the new source-impedance, such that various embodiments optimize radiation efficiency. To this end, first and second sections can be modified and/or designed to enable maximizing the tuning. This could include subtracting a portion of one of the sections when they were already symmetrical. It could also include custom designing two separate sections that asymmetrical to interact optimally with the EMI resistance module.

Figure 5:
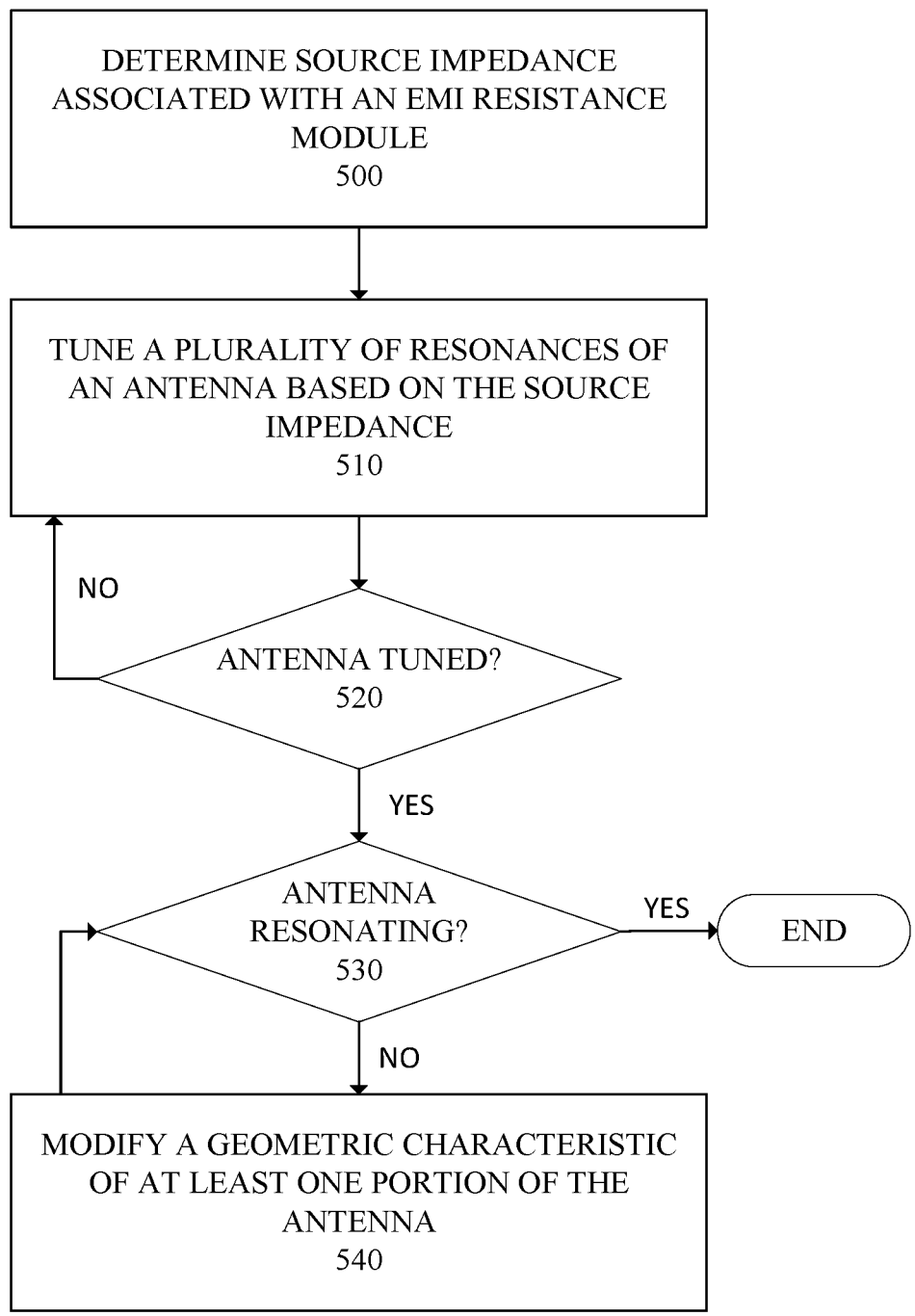
FIG. 5 is a flowchart that illustrates the steps in making the EMI resistant, optimized antenna according to another embodiment.

FIG. 5 is a flowchart that illustrates the steps in making the EMI resistant, optimized antenna according to another embodiment. At step 500, a source-impedance is determined for an antenna. The source-impedance is impacted by an EMI resistance module, for example a ferrited cable, that impacts the operation of the antenna. Once the EMI resistance module is designed and its impact on the antenna understood, the is tuned at step 510. This can include, for example, tuning the antenna to a plurality of resonances (e.g., 5) such that radiation efficiency in the antenna is optimized based on the environment which includes the EMI resistance module.

At step 520, it is determined whether the antenna is tuned. If the antenna is not tuned, step 510 repeats wherein the antenna is tuned again and re-tested. Once the antenna is tuned, it is determined whether the antenna is resonating at step 530. If the antenna is not resonating, then at step 540 at least one geometric characteristic of the antenna is modified. This could include altering the mechanical structure of at least one portion of the antenna such that a first and a second portion of the antenna are no longer mechanically symmetrical. Thereafter, step 530 is repeated until the antenna resonates and the process is complete.

Although the subject matter has been described in language specific to structural features and/or methodological acts, it is to be understood that the subject matter defined in the appended claims is not necessarily limited to the specific features or acts described above.

Rather, the specific features and acts described above are disclosed as example forms of implementing the claims.

What is claimed:
1. A device comprising:
   a cable attached at a first end to a radio module, the cable having a plurality of electro-magnetic interference (EMI) resistant elements connected at a plurality of positions wherein the EMI resistant elements include first and second ferrites, the first ferrite spaced at a distance from the second ferrite;
   a radial board wherein the cable is attached thereto at a second end; and
   an antenna connected to the radial board, the antenna being configured to receive power from the radio module and to radiate, wherein the antenna has first and second portions, the first and second portions being mechanically asymmetrical, and wherein an electrical effect between the plurality of EMI resistant elements and the mechanically asymmetrical first and second portions results in the antenna being substantially electrically symmetrical.

2. The device of claim 1, wherein the first and second portions have first and second horizontal ridges.

3. The device of claim 2, wherein the first horizontal ridge is longer then the second horizontal ridge.

4. The device of claim 1, wherein the first and second ferrites are spaced a second distance from the first end of the cable.

5. The device of claim 1, further comprising a board wherein the antenna is affixed thereto, and wherein the antenna is electrically symmetrical with respect to elements on the board.

6. The device of claim 2, wherein a difference in geometry between the first horizontal ridge and the second horizontal ridge is based on an impedance of the cable.

\* \* \* \* \*